(12) United States Patent
Yates et al.

(10) Patent No.: US 6,750,803 B2
(45) Date of Patent: Jun. 15, 2004

(54) TRANSFORMER REMOTE CONTROL

(75) Inventors: William Allen Yates, Camarillo, CA (US); Jack A. Segal, Oxnard, CA (US); Eric Paul Rose, Tarzana, CA (US)

(73) Assignee: Interlink Electronics, Inc., Camarillo, CA (US)

( * ) Notice: Subject to any disclaimer, the term of this patent is extended or adjusted under 35 U.S.C. 154(b) by 563 days.

(21) Appl. No.: 09/791,329

(22) Filed: Feb. 23, 2001

(65) Prior Publication Data

US 2002/0118131 A1 Aug. 29, 2002

(51) Int. Cl.$^7$ .......................... G08C 19/12; H04L 17/02
(52) U.S. Cl. ..................... 341/176; 345/158; 345/173
(58) Field of Search .......................... 341/176; 345/156, 345/173, 158; 348/734; 359/142

(56) References Cited

U.S. PATENT DOCUMENTS

| | | |
|---|---|---|
| 4,855,746 A | 8/1989 | Stacy |
| 4,959,721 A | 9/1990 | Micic et al. |
| 5,151,696 A | 9/1992 | Kasahara et al. |
| 5,402,151 A * | 3/1995 | Duwaer ................ 345/173 |
| 5,408,284 A | 4/1995 | Berger et al. |
| 5,410,326 A | 4/1995 | Goldstein |
| 5,515,079 A | 5/1996 | Hauck |
| 5,568,963 A | 10/1996 | Bennett et al. |
| 5,724,106 A | 3/1998 | Autry et al. |
| 5,920,308 A | 7/1999 | Kim |
| 5,956,025 A * | 9/1999 | Goulden et al. ........ 345/327 |
| 6,069,614 A * | 5/2000 | Singhal ................ 345/158 |
| 6,388,660 B1 * | 5/2002 | Manser et al. ........... 345/173 |
| 2001/0040551 A1 | 11/2001 | Yates et al. |

FOREIGN PATENT DOCUMENTS

DE 42 33 238 A1 10/1992

OTHER PUBLICATIONS copy of International Preliminary Examination Report for PCT/US02/04435, Interlink Electronics, mailed Jan. 22, 2004.

* cited by examiner

Primary Examiner—Timothy Edwards
(74) Attorney, Agent, or Firm—Brooks Kushman P.C.

(57) ABSTRACT

A remote control includes a touch pad operable in two or more touch pad modes and a switching mechanism for controlling devices having display screens such as home entertainment (HE) devices, slide projectors, and computers. The switching mechanism is operable with the touch pad for switching the touch pad between the touch pad modes. The touch pad modes include an absolute touch pad mode, a relative touch pad mode, and an annotate touch pad mode. The remote control includes a control button operable in two or more control button modes. Each of the control button modes corresponds to a respective touch pad mode. The switching mechanism is operable with the control button for switching the control button to the control button mode corresponding to the respective touch pad mode. The remote control also includes an indicator operable for displaying control button indicator modes each indicative of a respective control button mode. The switching mechanism is operable with the indicator for switching the indicator to the control button indicator mode corresponding to the control button mode. The touch pad may include two control icons representative of remote control commands. The control icons are enabled when the touch pad is in a first touch pad mode and disabled when the touch pad is in a second touch pad mode.

15 Claims, 4 Drawing Sheets

TRANSFORMER REMOTE CONTROL

TECHNICAL FIELD

The present invention relates generally to remote controls and, more particularly to a remote control having a touch pad operable in a plurality of modes.

BACKGROUND ART

Operators use remote controls for remotely controlling a variety of devices including home entertainment, computer, and presentation devices. Such home entertainment devices include televisions, video cassette recorders, set top boxes, and stereos. Such computer devices include desktop and laptop computers. Such presentation devices include slide projectors. Operators use remote controls to control basic functions of the devices such as turning the device on and off. Remote controls are often used in conjunction with display screens of the devices to facilitate simple control of the devices. For instance, the display screens may have a cursor which the operator can navigate the cursor on the display screen by manipulating the remote control. Further, the display screens may have a menu of choices and the operator can select a choice in the menu by manipulating the remote control. The display screens may also have graphical user interfaces (GUI) or the like and the operator can enter information into the GUI by manipulating the remote control. Remote controls may also be used to facilitate advanced control of the devices for applications such as electronic commerce, communications, and the like.

Typically, remote controls include a set of buttons which correspond to control functions of a device. Remote controls have been improved such that the buttons may be used to control functions of multiple devices. Touch pads or other position sensing devices have been incorporated into remote controls to provide the operator with greater control functionality. Touch pads sense the position of an object such as the operator's finger or stylus touching the touch pad and convey the position information to the display screen of the device. In response, an object on the display screen such as a cursor moves in correspondence with the position of the object touching the touch pad.

A problem with typical remote controls having integrated touch pads is that the touch pads are only operable in one mode. It is desired that the touch pads be operable in a plurality of modes depending upon the needs of the operator. For example, there are conflicting purposes for remote controls in a slide show meeting environment. On the one hand, there is the executive presenter who has no time to learn about the sophisticated control capabilities that remote controls offer. The executive presenter simply wants to push a forward button to advance slides, a backwards button to reverse slides, and, perhaps, a laser button to embellish message points. On the other hand, another presenter may need extended remote control functions such as computer mousing, program launching, and menu selection. In short, this presenter needs point, click, and drag functionality as well as the forwards, backwards, and laser functionality of the executive presenter. Currently, two different remote controls are used to address the needs of both presenters.

SUMMARY OF THE INVENTION

Accordingly, it is an object of the present invention to provide a remote control having a touch pad operable in a plurality of modes.

In carrying out the above object and other objects, the present invention provides a remote control having a touch pad operable in at least two touch pad modes and a switching mechanism operable with the touch pad for switching the touch pad between the at least two touch pad modes. The at least two touch pad modes may include an absolute touch pad mode, a relative touch pad mode, and an annotate touch pad mode.

The remote control may further include at least one control button operable to switch between at least two control button modes. Each of the at least two control button modes corresponds to a respective touch pad mode. The switching mechanism is operable with the at least one control button for switching the at least one control button to the control button mode corresponding to the touch pad mode.

The remote control may also include an indicator operable for displaying at least two control button indicator modes each indicative of a respective control button mode. The switching mechanism is operable with the indicator for switching the indicator to the control button indicator modes corresponding to the control button mode.

The touch pad may include at least two control icons representative of remote control commands. The at least two control icons are enabled when the touch pad is in a first touch pad mode and disabled when the touch pad is in a second touch pad mode. Two respective control icons may be representative of a forward slide remote control command and a backwards slide remote control command. Other respective control icons may be representative of a channel up remote control command, a channel down remote control command, an audio signal up remote control command, and an audio signal down remote control command.

Further, in carrying out the above object and other objects, the present invention provides a remote control for controlling a device having a display screen. This remote control includes a touch pad operable in at least two touch pad modes. In a first touch pad mode the touch pad is mapped relatively to a display screen of a device such that each location of the touch pad corresponds to a respective location of the display screen. In a second touch pad mode the touch pad is mapped absolutely to the display screen as a function of the dimensions of the touch pad and the display screen such that each location of the touch pad corresponds to a respective object displayed on the display screen. The remote control also includes a switching mechanism operable with the touch pad for switching the touch pad between the at least two touch pad modes.

Also, in carrying out the above object and other objects, the present invention provides a remote control for controlling a slide projector device having a display screen. This remote control includes a touch pad operable in at least two touch pad modes. The touch pad includes two control icons respectively representative of a forward slide remote control command for forwarding a slide displayed on the display screen upon actuation and a backwards slide remote control command for reversing a slide displayed on the display screen. The two control icons are enabled when the touch pad is in a first touch pad mode and disabled when the touch pad is in a second touch pad mode. The remote control further includes a switching mechanism operable with the touch pad for switching the touch pad between the at least two touch pad modes.

This remote control may also include at least one control button operable in at least two control button modes including a pointing mode. Each of the at least two control button modes corresponds to a respective touch pad mode. The at least one control button generates a pointing signal for pointing to the display screen when the touch pad is in the first touch pad mode. The switching mechanism is operable with the at least one control button for switching the at least one control button between the at least two control button modes as a function of the at least two positions of the switching mechanism.

In carrying out the above object and other objects, the present invention also provides a remote control for controlling a device. The remote control includes a touch pad operable in at least two touch pad modes. The touch pad includes at least two control icons respectively representative of device control commands. The at least two control icons are enabled when the touch pad is in a first touch pad mode and disabled when the touch pad is in a second touch pad mode. The remote control also includes a switching mechanism operable with the touch pad for switching the touch pad between the at least two touch pad modes.

The above object and other objects, features, and advantages of the present invention are readily apparent from the following detailed description of the best mode for carrying out the present invention when taken in connection with the accompanying drawings.

BEST MODES FOR CARRYING OUT THE INVENTION

Figure 1:
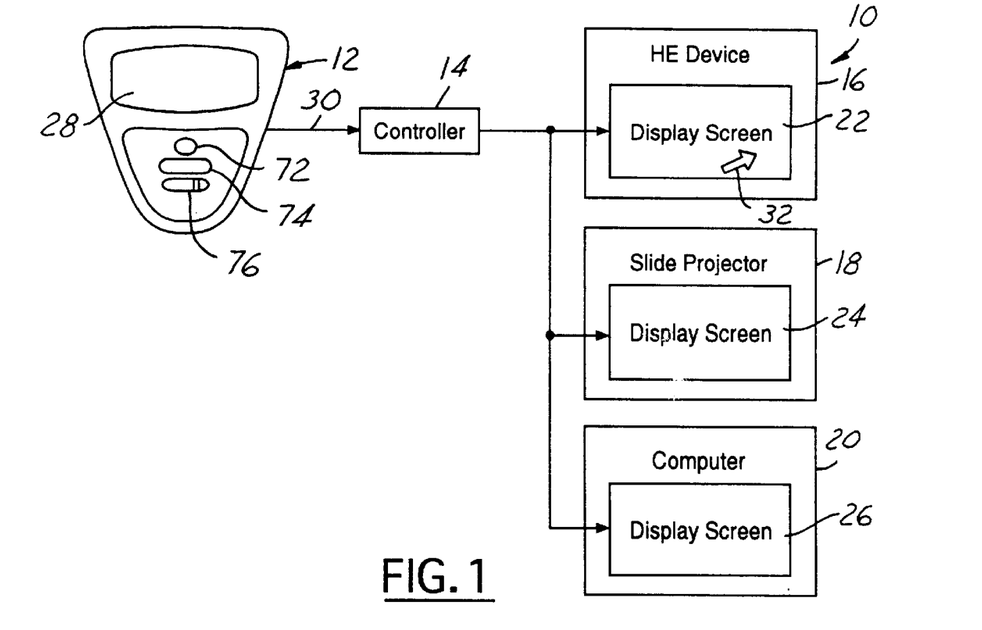
FIG. 1 illustrates a block diagram of a remote control system having a remote control in accordance with the present invention.

Referring now to FIG. 1, a block diagram of a remote control system 10 in accordance with the present invention is shown. Remote control system 10 includes a remote control 12, a controller 14, and a device to be remotely controlled by the remote control such as a home entertainment (HE) device 16, a slide projector 18, a computer 20, or the like. HE device 16, slide projector 18, and computer 20 each include a respective display screen 22, 24, and 26. Remote control 12 includes a position sensing device such as a touch pad 28. Touch pad 28 generates a signal in response to an operator touching the touch pad with a finger or stylus. The signal is indicative of the location of the touch on touch pad 28. The signal may also be indicative of the duration and the pressure of the touch on touch pad 28 for each location being touched.

Touch pad 28 is operable with each display screen such as display screen 22 of HE device 16 in absolute and relative modes. In the absolute mode, the area of touch pad 28 is absolutely mapped to the area of display screen 22. This means that each portion of touch pad 28 corresponds to a respective portion of display screen 22. For instance, the upper left portion of touch pad 28 corresponds to the upper left portion of display screen 22. Similarly, the middle bottom portion of touch pad 28 corresponds to the middle bottom portion of display screen 22. Touch pad 28 is in the absolute mode when the dimensions of the touch pad is absolutely mapped to the dimensions of display screen 22.

In operation, the area of touch pad 28 is mapped to various control panels and menus displayed on display screen 22. This allows the operator to manipulate touch pad 28 to select control function entries of the panels and menus displayed on display screen 22 while remaining visually focused on the display screen. Preferably, display screen 22 has a much larger area than the area of touch pad 28. The absolute mapping between touch pad 28 and display screen 22 is scaled as a function of the ratio of the dimensions of the touch pad and the display screen. Display screen 22 is at least part or all of the display screen area of HE device 16.

Controller 14 is operable with touch pad 28 for receiving a signal 30 from the touch pad in response to an operator touching the touch pad. In the absolute mode, controller 14 highlights a portion of display screen 22 in response to a corresponding area of touch pad 28 being touched. Controller 14 highlights a portion of display screen 22 to enable a control function corresponding to the highlighted portion of the display screen for controlling HE device 16. Instead of highlighting portions of display screen 22, controller 14 may user color change, outlining, or other ways of distinguishing the selected portions of display screen 22.

In the absolute mode, controller 14 highlights the portion of display screen 22 corresponding to the respective portion of touch pad 28 being touched independent of the display screen portion highlighted prior to the touch pad being touched. Wherever the operator touches touch pad 28 the corresponding portion of display screen 22 is highlighted regardless of where the operator touched the touch pad previously. That is, the touching movement on touch pad 28 is mapped absolutely on to display screen 22.

In the relative mode, controller 14 moves an object such as a cursor 32 on display screen 22 to the location on the display screen corresponding to the location of the touch on touch pad 28 in response to an operator touching the touch pad. Controller 14 controls HE device 16 to enable a control function corresponding to the location of cursor 32 on display screen 22 in response to an operator touching touch pad 28.

Controller 14 such as a set top box may be coupled directly to or remotely located from HE device 16. Remote control 12 transmits infrared (IR) or radio frequency (RF) touch pad signals to communicate with controller 14. Traditional pointing devices such as a computer mouse use relative pointing to enable the operator to move a cursor from one place to another on a display screen.

Figure 2:
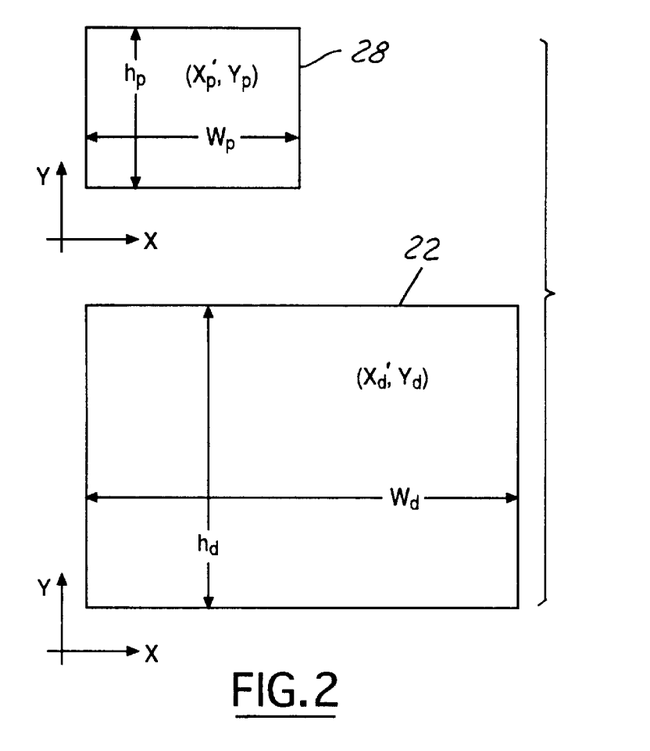
FIG. 2 illustrates the absolute position mapping of the touch pad of the remote control with respect to a display screen.

Referring now to FIG. 2, the absolute positioning mapping of touch pad 28 with respect to display screen 22 will now be described in further detail. As mentioned above, touch pad 28 is operable with display screen 22 such that the dimensions of the touch pad is absolutely mapped to the dimensions of either a portion of the display screen or the entire display screen. As an example, it will be assumed that the area of touch pad 28 is absolutely mapped to the entire area of display screen 22. Thus, each point of touch pad 28 has a corresponding absolute point on display screen 22. Touch pad 28 has an area defined by a width $w_p$ and a height $h_p$. Display screen 22 has an area defined by a width $w_d$ and a height $h_d$. A selected point of touch pad 28 such as point $x_p$, $y_p$ has a corresponding absolute point $x_d$, $y_d$. The corresponding absolute point $x_d$, $y_d$ of display screen 22 is related to the selected point $x_p$, $y_p$ of touch pad 28 in accordance with the following equations:

$$x_d = x_p * (w_d/w_p)$$

$$y_d = y_p * (h_d/h_p).$$

That is, the x coordinate of the corresponding absolute point of display screen 22 ($x_d$) is equal to the x coordinate of the selected point of touch pad 28 ($x_p$) multiplied by the ratio between the widths of the display screen ($w_d$) and the touch pad ($w_p$). Similarly, the y coordinate of the corresponding absolute point of display screen 22 ($y_d$) is equal to the y coordinate of the selected point of touch pad 28 ($y_p$) multiplied by the ratio between the heights of the display screen ($h_d$) and the touch pad ($h_p$). As a result, each point of touch pad 28 has a corresponding absolute point on display screen 22.

If touch pad 28 is mapped to only a portion of the entire area of display screen 22 then the x coordinate of the corresponding absolute point of the portion of the display screen ($x_d$) is equal to the x coordinate of the selected point of touch pad 28 ($x_p$) multiplied by the ratio between the widths of the portion of the display screen and the touch pad. The y coordinate of the corresponding absolute point of the portion of display screen 22 ($y_d$) is equal to the y coordinate of the selected point of touch pad 28 ($y_p$) multiplied by the ratio between the heights of the portion of the display screen and the touch pad.

Figure 3:
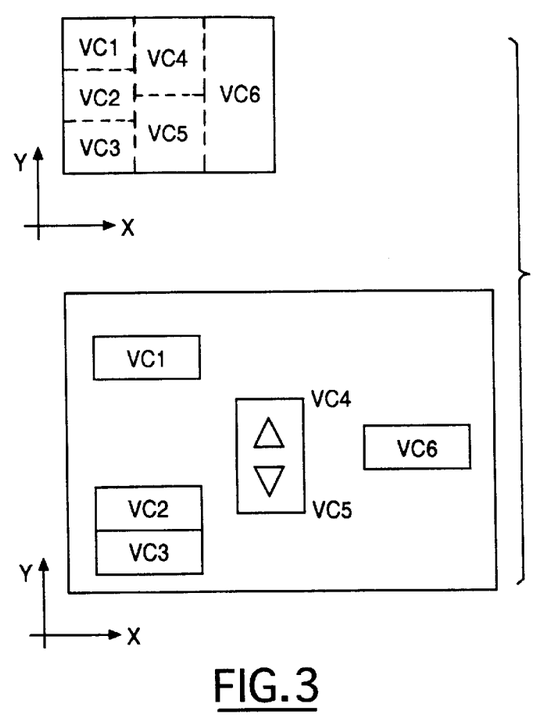
FIG. 3 illustrates the absolute control mapping of the touch pad of the remote control with respect to the display screen.

Referring now to FIG. 3, the absolute control mapping of touch pad 28 with respect to display screen 22 will now be described in further detail. As mentioned above, the area of touch pad 28 is mapped to various control panels and menus displayed on display screen 22. This allows the operator to manipulate touch pad 28 to select control function entries of the panels and menus displayed on display screen 22 while remaining visually focused on the display screen. The area of touch pad 28 is broken down into a plurality of virtual control areas (VC1, VC2, etc.). Display screen 22 (or a portion of the display screen) displays a plurality of virtual controls (VC1, VC2, etc.). Each virtual control area of touch pad 28 corresponds to a respective virtual control of display screen 22. For instance, virtual control area VC1 of touch pad 28 corresponds to virtual control VC1 of display screen 22 and virtual control area VC2 of the touch pad corresponds to virtual control VC2 of the display screen.

The entire area of touch pad 28 is mapped to virtual controls displayed on display screen 22 such that each point of the touch pad corresponds to a virtual control displayed on the display screen. Each virtual control area of touch pad 28 corresponds to a respective virtual control of display screen 22 as a function of the positions of the virtual control areas on the touch pad and the positions of the virtual controls on the display screen. For instance, virtual control area VC1 of touch pad 28 is in the upper left corner of the touch pad and corresponds to virtual control VC1 of display screen 22 located in the upper left corner of the display screen. Virtual control area VC6 of touch pad 28 is in the right side of the touch pad and corresponds to virtual control VC6 of display screen 22 located in the right side of the display screen.

There are three virtual controls in the left side of display screen 22 (VC1, VC2, and VC3) so the left side of touch pad 28 includes three corresponding virtual control areas (VC1, VC2, and VC3). There are two virtual controls in the middle of display screen 22 (VC4, VC5) so the middle of touch pad 28 includes two corresponding virtual control areas (VC4, VC5). Finally, there is one virtual control in the right side of display screen 22 (VC6) so the right side of touch pad 28 includes one corresponding virtual control area (VC6).

In operation, the operator touches a point of touch pad 28 falling within a certain virtual control area. In response, the virtual control of display screen 22 corresponding to the certain virtual control area is selected or actuated. HE device 16 is then controlled as a function of the selected control.

Figure 4A:
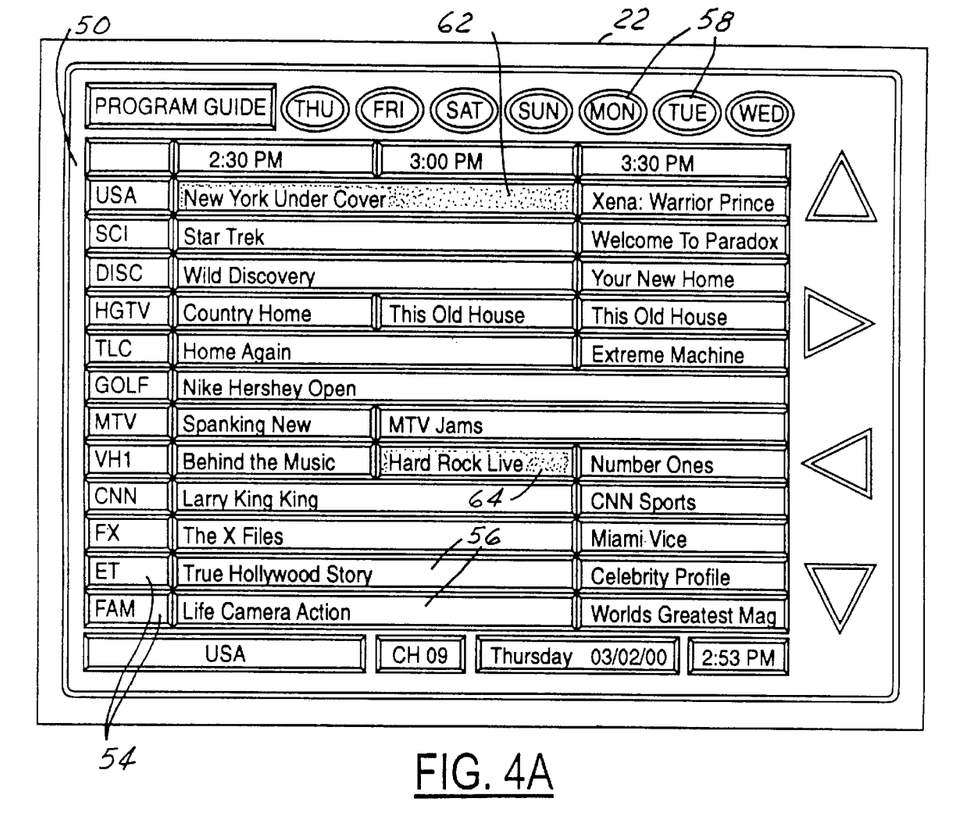
FIG. 4A illustrates an electronic program guide (EPG) displayed on the display screen.
Figure 4B:
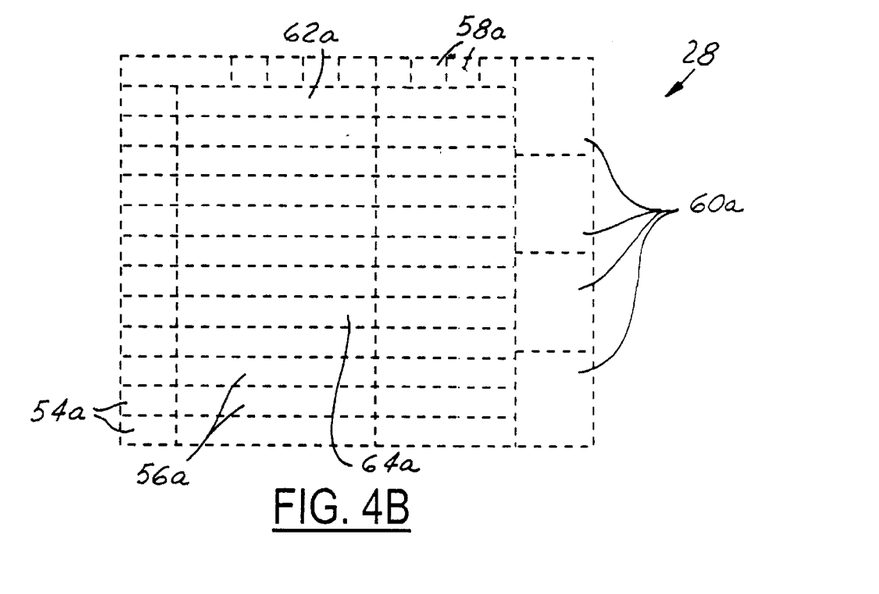
FIG. 4B illustrates the virtual control areas of the touch pad of the remote control corresponding to the grid areas of the EPG displayed on the display screen.

Referring now to FIGS. 4A and 4B, the operation of remote control 12 in the absolute mode for controlling devices 16, 18, and 20 will now be described. FIG. 4A illustrates an electronic program guide (EPG) 50 displayed on display screen 22. EPG 50 includes a plurality of grids such as channel grids 54 for listing cable channels and program title guides 56 for listing programs associated with the cable channels during given times. Highlighted program title grid 62 identifies the program playing on HE device 16. EPG 50 further includes day grids 58 for the operator to select a day to view the available programs for the selected day. EPG 50 also includes arrow keys 60 to move sets of grids of the EPG up and down or sideways.

Referring now to FIG. 4B, with continual reference to FIG. 4A, the virtual control areas of touch pad 28 is mapped absolutely to EPG 50 and each grid of the EPG corresponds to a respective portion of the touch pad. The operator touches a portion of touch pad 28 to highlight the corresponding grid of EPG 50. For example, the operator touches a virtual control area 54a in the left hand side of touch pad 28 to highlight a corresponding channel grid 54 of EPG 50. The operator may touch a virtual control area 56a of touch pad 28 to highlight a corresponding program title grid 56 of EPG 50. Similarly, virtual control areas 58a, 60a, 62a, and 64a are mapped to corresponding grids of EPG 50. As the operator touches different portions of touch pad 12 the corresponding grids of EPG 50 are highlighted.

In operation, the operator may touch virtual control area 64a in the middle portion of touch pad 28 to highlight program title grid 64. The operator may then select the program of program title grid 64 to view the program by pressing a button of remote control 12. In response to program title grid 64 being selected the cable channel is changed to the associated channel and the program of program title grid 64 is displayed on the entire display screen 22. Concurrently, EPG 50 disappears from display screen 22.

Figure 5:
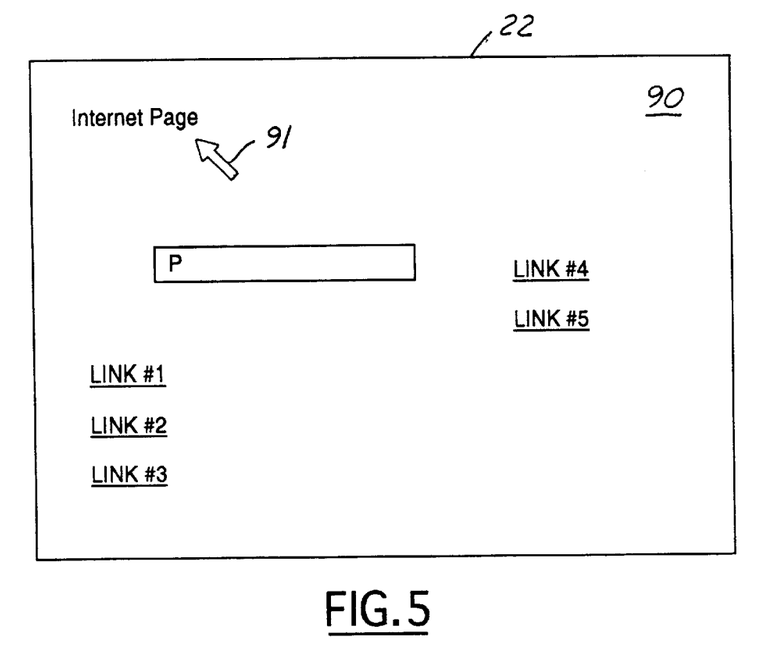
FIG. 5 illustrates an web page displayed on the display screen.

Referring now to FIG. 5, the of remote control 12 in the relative mode for controlling devices 16, 18, and 20 will now be described. FIG. 5 illustrates a web or Internet page 90 displayed on display screen 22. A cursor 91 is displayed over Internet page 90 to enable the operator to navigate through the Internet page. Because the area of an Internet page is typically bigger than the area of a display screen touch pad 28 is used in a relative mode. In the relative mode, the operator moves cursor 91 by moving his finger across touch pad 28. Controller 14 moves cursor 91 to the location on Internet page 90 corresponding to the location of the touch on touch pad 28 in response to an operator touching the touch pad.

Touch pad 28 may also function in the absolute mode when display screen 22 is displaying Internet page 90. In the absolute mode, the area of touch pad 28 is mapped absolutely to the area of Internet page 90. Each portion of Internet page 90 corresponds to a respective portion of touch pad 28. The operator highlights links on the Internet page 90 by moving his finger to the corresponding portion of touch pad 28. The operator may then select a highlighted link by using a control button of remote control 12.

Figures 6, 7, 8:
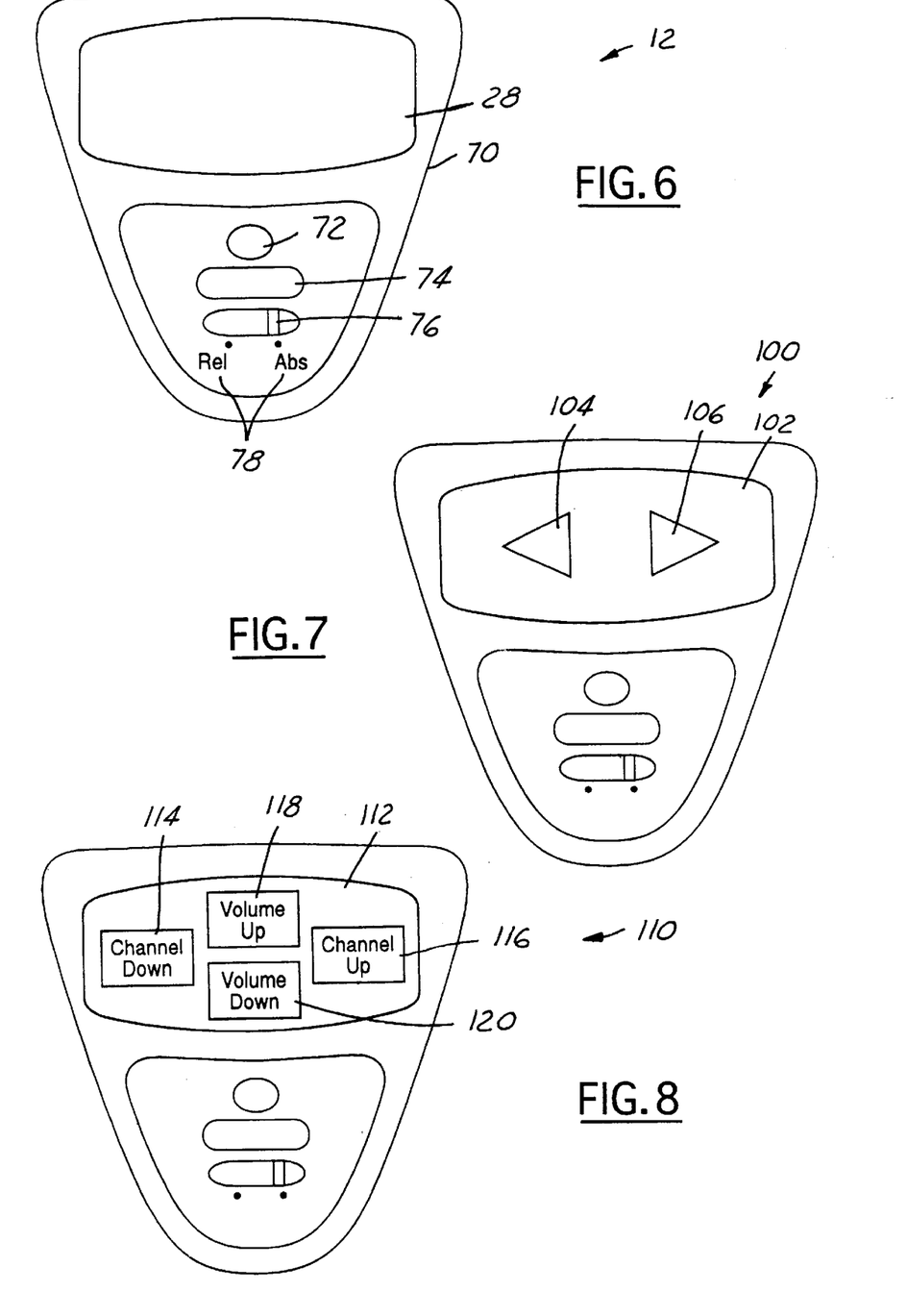
FIG. 6 illustrates the remote control in accordance with the present invention.
FIG. 7 illustrates a remote control in accordance with an alternative embodiment of the present invention.
FIG. 8 illustrates a remote control in accordance with another embodiment of the present invention.

Referring now to FIG. 6 with continual reference to FIG. 1, remote control 12 will now be described in greater detail. Remote control 12 is configured within a hand held sized housing 70. In addition to touch pad 28, remote control 12 includes at least one control button 72, an indicator window 74, and a switching mechanism 76.

Control button 72 is operable to generate a control button signal upon actuation by an operator. The control button signal depends on the current mode of touch pad 28. For example, control button 72 may function as a computer mouse click button on a computer mouse and generate a computer mouse click signal upon being pressed by the operator when touch pad 28 is in the relative mode. Control button 72 may also function as a point button and generate a pointing signal for highlighting an area of display screen 22 upon being pressed by the operator when touch pad 28 is in the absolute mode and while the operator is pointing the remote control at the area of display screen.

Indicator window 74 displays an indication of the current function of control button 72. For example, when touch pad 28 is in the relative mode indicator window 74 displays "CLICK" to indicate that control button 72 is functioning as a computer mouse click button. Similarly, when touch pad 28 is in the absolute mode indicator window 74 displays "POINT" to indicate that control button 72 is functioning as a pointing button. Indicator window 74 may be an LCD or a character LED or any other method of indication for displaying an indication of the current function of control button 72.

Switching mechanism 76 is a mechanical or electrical switch that is switchable between at least two positions. Each position of switching mechanism 76 corresponds to a mode of touch pad 28. The operator switches switching mechanism 76 to switch, i.e., transform, touch pad 28 between the absolute and relative modes. Switching mechanism 76 may include indicia such as "REL" and "ABS" to indicate to the operator the positions of switching mechanism with respect to the modes of touch pad 28.

Generally, touch pad 28 is operable in absolute and relative modes. In the relative mode, touch pad 28 functions like a computer mouse and movement on the touch pad causes relative movement of an object such as a pointer 32 on display screen 22. In the absolute mode, touch pad 28 functions like a set of discrete virtual control buttons where pressing the touch pad in the zone of a virtual control button transmits a control signal for that virtual control button. As described above, the virtual control buttons may correspond to areas of display screen 22 such that the operator can touch a virtual control button without looking at touch pad 28 and remaining visually focused on the display screen.

Touch pad 28 may also be operable in other modes in addition to the absolute and relative modes. For example, touch pad 28 may function in an annotate mode in which the touch pad becomes a virtual sketch pad. In the annotate mode, touching touch pad 28 causes an "ink trail" to be left on display screen 22.

In order to enable an operator to control devices 16, 18, and 20, touch pad 28 may incorporate icons representative of control commands. These icons are enabled when touch pad 28 is in a first mode such as a control mode and disabled when the touch pad is in a second mode such as a navigate mode, i.e, computer mouse mode.

Referring now to FIG. 7, a remote control 100 in accordance with an alternative embodiment of the present invention is shown. Remote control 100 generally includes the same elements as the elements of remote control 12. The differences between these two remote controls is touch pad 102. Touch pad 102 includes icons 104 and 106 which represent respective control commands. Icons 104 and 106 are positioned on touch pad 102 using ink screen techniques as known in the art. For instance, icons 104 and 106 represent forward slide and reverse slide control commands for moving slides displayed on display device 24 of slide projector 18. Slide projector 18 generally is a computer device having a display screen for displaying slides such as those made in PowerPoint slide presentations. Icons 104 and 106 are enabled when touch pad 102 is in the control mode and are disabled when the touch pad is in the navigate mode. In operation, an operator touches portions of touch pad 28 corresponding to icons 104 and 106 for moving a slide displayed on slide projector 18 when the touch pad is in the control mode. In response to an icon 104 and 106 being touched, remote control transmits an appropriate slide move control command to slide projector 18. Touching portions of touch pad 28 corresponding to icons 104 and 106 do not enable any slide move control commands when the touch pad is in the navigate mode.

It should be appreciated that all kinds of icons representative of respective control commands may be incorporated onto the touch pad. FIG. 8 illustrates a remote control 110 in accordance with another embodiment of the present invention. Remote control 110 includes a touch pad 112 having icons 114, 116, 118, and 120. Icons 114, 116, 118, and 120 represent respective control commands such as channel up, channel down, volume up, and volume down. The channel up and down commands are used to change the channel of a device such as a television being controlled by remote control 110. Similarly, the volume up and down commands are used to change the volume of an audio device such as a television.

Icons 114, 116, 118, and 120 are enabled when touch pad 112 is in the control mode and are disabled when the touch pad is in the navigate mode. In operation, an operator touches portions of touch pad 28 corresponding to icons 114 and 116 for changing the channel when the touch pad is in the control mode. Similarly, an operator touches portions of touch pad 28 corresponding to icons 118 and 120 for changing the volume when the touch pad is in the control mode. Touching portions of touch pad 28 corresponding to icons 112, 114, 116, and 118 do not enable any slide move control commands when the touch pad is in the navigate mode.

Thus it is apparent that there has been provided, in accordance with the present invention, a remote control having a touch pad that fully satisfies the objects, aims, and advantages set forth above. While the present invention has been described in conjunction with specific embodiments thereof, it is evident that many alternatives, modifications, and variations will be apparent to those skilled in the art in light of the foregoing description. Accordingly, it is intended to embrace all such alternatives.

What is claimed is:

1. A remote control for controlling a device having a display screen operable to display a cursor and objects, the remote control comprising:

a transmitter operable with the device for wirelessly transmitting remote control signals to the device in order to control operation of the device;

a touch pad operable with the transmitter for remotely controlling operation of the display screen of the device, the touch pad being operable in at least two touch pad modes, wherein in a first touch pad mode the touch pad is mapped relatively to the display screen of the device such that movement on the touch pad causes relative movement of the cursor displayed on the display screen, wherein in a second touch pad mode the touch pad is mapped absolutely to the display screen as a function of the dimensions of the touch pad and the display screen such that each and every area of the touch pad corresponds to respective objects displayed on the display screen as a function of the positions of the touch pad areas and the displayed positions of the objects and such that touching the touch pad within one of the touch pad areas causes the corresponding displayed object to be selected; and a switching mechanism operable with the touch pad for switching the touch pad between the at least two touch pad modes.

2. The remote control of claim 1 further comprising:

at least one control button operable to switch between at least two control button modes, each of the at least two control button modes corresponding to a respective touch pad mode, wherein the switching mechanism is operable with the at least one control button for switching the at least one control button to the control button mode corresponding to the touch pad mode.

3. The remote control of claim 2 further comprising:

an indicator operable for displaying at least two control button indicator modes each indicative of a respective control button mode, wherein the switching mechanism is operable with the indicator for switching the indicator to the control button indicator mode corresponding to the control button mode.

4. A remote control for controlling a slide projector having a display screen operable for displaying a cursor and slides, the remote control comprising:

a transmitter operable with the slide projector for wirelessly transmitting remote control signals to the device in order to control operation of the slide projector;

a touch pad operable with the transmitter for remotely controlling operation of the display screen of the slide projector, the touch pad being operable in a control touch pad mode and a navigation touch pad mode, wherein the touch pad includes two permanently displayed control icons respectively representative of a forward slide projector remote control command for forwarding the slide displayed on the display screen to a new slide upon actuation and a backwards slide projector remote control command for reversing the slide displayed on the display screen to an old slide upon actuation, wherein the two control icons are enabled when the touch pad is in the control touch pad mode and disabled when the touch pad is in the navigation touch pad mode, wherein in the navigation mode the touch pad is mapped relatively to the display screen such that movement on the touch pad causes relative movement of the cursor displayed on the display screen; and a switching mechanism operable with the touch pad for switching the touch pad between the touch pad modes.

5. The remote control of claim 4 further comprising:

at least one control button operable to switch between at least two control button modes including a pointing mode, each of the at least two control button modes corresponding to a respective touch pad mode, wherein the at least one control button is in the pointing mode and generates a pointing signal for pointing to the display screen when the touch pad is in the control touch pad mode, wherein the switching mechanism is operable with the at least one control button for switching the at least one control button to the control button mode corresponding to the respective touch pad mode.

6. The remote control of claim 5 further comprising:

an indicator operable for displaying at least two control button indicator modes each indicative of a respective control button mode, wherein the switching mechanism is operable with the indicator for switching the indicator to the control button indicator mode corresponding to the respective control button mode.

7. A remote control system comprising:

a device having a display screen operable to display a cursor and objects; and a remote control operable with the device for wirelessly transmitting remote control signals to the device in order to control operation of the device, the remote control having a touch pad operable in at least two touch pad modes;

wherein in a first touch pad mode the touch pad is mapped relatively to the display screen of the device such that movement on the touch pad causes relative movement of the cursor displayed on the display screen;

wherein in a second touch pad mode the touch pad is mapped absolutely to the display screen of the device as a function of the dimensions of the touch pad and the display screen such that each and every area of the touch pad corresponds to respective objects displayed on the display screen as a function of the positions of the touch pad areas and the displayed positions of the objects and such that touching the touch pad within one of the touch pad areas causes the corresponding displayed object to be selected;

the remote control further having a switching mechanism operable with the touch pad for switching the touch pad between the at least two touch pad modes.

8. The system of claim 7 wherein:

the remote control further includes at least one control button operable to switch between at least two control button modes, each of the at least two control button modes corresponding to a respective touch pad mode, wherein the switching mechanism is operable with the at least one control button for switching the at least one control button to the control button mode corresponding to the touch pad mode.

9. The system of claim 8 wherein:

the remote control further includes an indicator operable for displaying at least two control button indicator modes each indicative of a respective control button mode, wherein the switching mechanism is operable with the indicator for switching the indicator to the control button indicator mode corresponding to the control button mode.

10. A slide projector system comprising:

a slide projector having a display screen operable for displaying a cursor and slides; and a remote control operable with the slide projector for wirelessly transmitting remote control signals to the slide projector in order to control operation of the slide projector, the remote control having a touch pad operable in control and navigation touch pad modes;

wherein the touch pad includes two permanently displayed control icons respectively representative of a forward slide projector remote control command for forwarding the slide displayed on the display screen to a new slide upon actuation and a backwards slide projector remote control command for reverting the slide displayed on the display screen to an old slide upon actuation, wherein the two control icons are enabled when the touch pad is in the control touch pad mode and are disabled when the touch pad is in the navigation touch pad mode, wherein in the navigation mode the touch pad is mapped relatively to the display screen such that movement on the touch pad causes relative movement of the cursor displayed on the display screen;

the remote control further having a switching mechanism operable with the touch pad for switching the touch pad between the touch pad modes.

11. The system of claim 10 wherein:

the remote control further includes at least one control button operable to switch between at least two control button modes including a pointing mode, each of the at least two control button modes corresponding to a respective touch pad mode, wherein the at least one control button is in the pointing mode and generates a pointing signal for pointing to the display screen when the touch pad is in the control touch pad mode, wherein the switching mechanism is operable with the at least one control button for switching the at least one control button to the control button mode corresponding to the respective touch pad mode.

12. The system of claim 11 wherein:

the remote control further includes an indicator operable for displaying at least two control button indicator modes each indicative of a respective control button mode, wherein the switching mechanism is operable with the indicator for switching the indicator to the control button indicator mode corresponding to the respective control button mode.

13. A remote control system comprising:

a device having a display screen operable to display a cursor; and a remote control operable with the device for wirelessly transmitting remote control signals to the device in order to control operation of the device, the remote control having a touch pad operable in control and navigation modes, the touch pad having at least one permanently displayed control icon representative of a control command which controls the device upon actuation;

wherein when the touch pad is in the control mode the at least one control icon is enabled;

wherein when the touch pad is in the navigation mode the at least one control icon is disabled and the touch pad is mapped relatively to the display screen such that movement on the touch pad causes relative movement of the cursor displayed on the display screen;

the remote control further having a switching mechanism operable with the touch pad for switching the touch pad between the control and navigation modes.

14. The system of claim 13 wherein:

the remote control further includes at least one control button operable to switch between at least two control button modes, each of the at least two control button modes corresponding to a respective touch pad mode, wherein the switching mechanism is operable with the at least one control button for switching the at least one control button to the control button mode corresponding to the touch pad mode.

15. The system of claim 14 wherein:

the remote control further includes an indicator operable for displaying at least two control button indicator modes each indicative of a respective control button mode, wherein the switching mechanism is operable with the indicator for switching the indicator to the control button indicator mode corresponding to the control button mode.

* * * * *